(12) United States Patent
Cho et al.

(10) Patent No.: US 10,034,085 B2
(45) Date of Patent: Jul. 24, 2018

(54) CLASS-D AMPLIFIER, AUDIO PROCESSING APPARATUS AND METHOD OF DRIVING CLASS-D AMPLIFIER

(71) Applicant: Korea Advanced Institute of Science and Technology, Daejeon (KR)

(72) Inventors: Gyu-Hyeong Cho, Daejeon (KR); Ji-Hun Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/345,926

(22) Filed: Nov. 8, 2016

(65) Prior Publication Data
US 2017/0149403 A1    May 25, 2017

(51) Int. Cl.
| | |
|---|---|
| H03G 3/00 | (2006.01) |
| H04R 3/00 | (2006.01) |
| H03F 3/183 | (2006.01) |
| H03F 3/217 | (2006.01) |
| H03F 3/45 | (2006.01) |
| H03G 3/30 | (2006.01) |

(52) U.S. Cl.
CPC ............ *H04R 3/007* (2013.01); *H03F 3/183* (2013.01); *H03F 3/2173* (2013.01); *H03F 3/4565* (2013.01); *H03F 3/45192* (2013.01); *H03G 3/3005* (2013.01); *H03G 3/3089* (2013.01); *H03F 2200/03* (2013.01); *H03F 2200/351* (2013.01); *H03F 2200/421* (2013.01); *H03F 2200/555* (2013.01); *H03F 2200/78* (2013.01)

(58) Field of Classification Search
CPC .... H03F 3/217; H03F 3/2173; H03F 2200/03; H03F 2200/351; H03G 3/3005

USPC .......................................................... 381/107
See application file for complete search history.

(56) References Cited

U.S. PATENT DOCUMENTS

| | | | |
|---|---|---|---|
| 7,482,870 B2 | 1/2009 | Maejima et al. | |
| 8,054,129 B2 | 11/2011 | Maejima | |
| 8,299,853 B2 | 10/2012 | Maejima | |
| 2007/0103234 A1* | 5/2007 | Maejima | H03F 3/217 330/207 A |
| 2008/0062731 A1 | 3/2008 | Chang et al. | |
| 2010/0073213 A1* | 3/2010 | Maruko | H03G 3/001 341/155 |

(Continued)

FOREIGN PATENT DOCUMENTS

KR    20070036008    4/2007

OTHER PUBLICATIONS

Korean Office Action (with English machine translation from Google) dated Jun. 30, 2016; for Korean App. No. 10-2015-0162653; 12 pages.

*Primary Examiner* — Katherine Faley
(74) *Attorney, Agent, or Firm* — Daly, Crowley, Mofford & Durkee, LLP

(57) ABSTRACT

A class-D amplifier includes an error amplification circuit, a duty signal generator, a level selection circuit, a driver and control block and an output stage. The class-D amplifier divides peal levels of an error signal into multi-level and changes a scheme for modulating the error signal when the error signal crosses each level boundary of the multi-level thereby to have an effect such as the error signal is folded. Therefore, the class-D amplifier drives output nodes with multi-level and thus the class-D amplifier may increasing efficiency while reducing EMI.

15 Claims, 14 Drawing Sheets

(56) References Cited

U.S. PATENT DOCUMENTS

2010/0219891 A1\* 9/2010 Tsuchiya ............... H03F 1/3205
330/251

\* cited by examiner

CLASS-D AMPLIFIER, AUDIO PROCESSING APPARATUS AND METHOD OF DRIVING CLASS-D AMPLIFIER

CROSS-REFERENCE TO RELATED APPLICATION

This application claims priority under 35 USC § 119 to Korean Patent Application No. 10-2015-0162653, filed on Nov. 19, 2015 in the Korean Intellectual Property Office (KIPO), the content of which is herein incorporated by reference in its entirety.

BACKGROUND

1. Technical Field

Exemplary embodiments relate generally to audio amplifiers, and more particularly to class-D amplifiers, audio processing apparatuses including the same and methods of driving the class-D amplifiers.

2. Description of the Related Art

A class-D audio amplifier is an audio power amplifier which drivers a loud speaker load by switching a pulse-width modulation (PWM) signal through the loud speaker load. The class-D audio amplifier has been introduced for solving electromagnetic interference (EMI) problems generated in other type of audio amplifiers. The conventional class-D audio amplifier, which is a switching amplifier, also has a problem of low efficiency when an output power of the conventional class-D audio amplifier is decreased.

SUMMARY

Some exemplary embodiments provide a class-D amplifier, capable of increasing efficiency while reducing EMI.

Some exemplary embodiments provide an audio processing apparatus including the class-D amplifier, capable of increasing efficiency while reducing EMI.

Some exemplary embodiments provide a method of driving the class-D amplifier.

According to exemplary embodiments, a class-D amplifier includes an error amplification circuit, a duty signal generator, a level selection circuit, a driver and control block and an output stage. The error amplification circuit outputs an error signal by amplifying a difference between an input signal and an output signal. The duty signal generator outputs a duty signal having a pulse width corresponding to a level of the error signal by performing a pulse width modulation (PWM) on the error signal based on a triangular wave signal. The level selection circuit receives the error signal and generates a level selection signal indicating a level to which the error signal belongs of a plurality of levels (multi-level) into which peak values of the error signal are divided. The driver and control block receives the duty signal, generates switching control signals corresponding to the duty signal in response to the level selection signal, and provides a selection signal to the duty signal generator. The output stage is connected to a ground voltage and a plurality of power supply voltages, and the output stage drives output nodes with at least two of the ground voltage and the power supply voltages in response to the switching control signals. The output signal is provided at the output nodes and the duty signal generator performs the PWM by chaining a modulation scheme in response to the selection signal when the error signal crosses each level boundary of the multi-level.

In exemplary embodiments, the input signal may be a differential analog signal and the output signal is digital.

In exemplary embodiments, the error amplification circuit may include a first differential amplifier, a second differential amplifier and a path selection unit. The first differential amplifier may receive the input signal through a first resistor coupled to a first node and a second resistor coupled to a second node, may receive the output signal through a third resistor coupled to the first node and a fourth resistor coupled to the second node, and may amplify the difference between the input signal and the output signal. The second differential amplifier may receive an output of the first differential amplifier through fifth and sixth resistors and may amplify the output of the first differential amplifier to output the error signal. The path selection unit may connect the output of the first differential amplifier to an input of the second differential amplifier by selecting one of a first path in a straight-forward direction and a second path in a diagonal direction in response to a path control signal.

The driver and control block may provide the path control signal to the path selection unit based on the levels selection signal.

In exemplary embodiments, the duty signal generator may include a first comparator, a second comparator, a triangular wave generator, a first inverter, a second inverter, a first multiplexer and a second multiplexer. The first comparator may compare a first component of the error signal with the triangular wave signal to output a first comparison signal. The second comparator may compare a second component of the error signal with the triangular wave signal to output a second comparison signal. The triangular wave generator may generate the triangular wave signal. The first inverter may invert the first comparison signal. The second inverter may invert the second comparison signal. The first multiplexer may select one of the first comparison signal and an output of the first inverter in response to the selection signal to provide a first duty component of the duty signal. The second multiplexer may select one of the second comparison signal and an output of the second inverter in response to the selection signal to provide a second duty component of the duty signal.

The driver and control block may provide the selection signal to the first and second multiplexers to change outputs of the first and second multiplexers when the error signal crosses each level boundary of the multi-level.

In exemplary embodiments, the class-D amplifier may further include a bias voltage generator that generates a plurality of bias voltages to a triangular wave generator that generates the triangular wave signal.

In exemplary embodiments, the level selection circuit may include a pulse generator and a state machine. The pulse generator may generate a first pulse signal and a second pulse signal based on the error signal, a first reference voltage and a second reference voltage. The state machine may generate the level selection signal in response to the first pulse signal and the second pulse signal. A level of the first reference voltage may be higher than a level of the second reference voltage.

The pulse generator may include a first comparator, a second comparator, a first AND gate and a second AND gate. The first comparator may compare the error signal and the first reference voltage. The second comparator may compare the error signal and the second reference voltage. The second comparator may compare the error signal and the second reference voltage. The first AND gate may perform an AND operation on an output of the first comparator and a check signal to provide the first pulse signal. The second AND gate may perform an AND operation on an output of the second comparator and the check signal to provide the second pulse signal.

The state machine may provide the driver and control block with the level selection signal based on logic levels of the first and second pulse signals, and the level selection signal may indicate one of a plurality of states using at least two voltages of the ground voltage and the power supply voltages and a transitions between the states.

In exemplary embodiments, the output stage may include a first switch network and a second switch network. The first switch network may be coupled to a first output node of the output node, and the first switch network may include first transistors connected in parallel between each of the ground voltage and the power supply voltages and the first output node. The second switch network may be coupled to a second output node of the output node, and the second switch network may include second transistors connected in parallel between the ground voltage and the power supply voltages and the second output node.

Each of the first transistors may include a first terminal coupled to each of the ground voltage and the power supply voltages, a second terminal coupled to the first output node and a gate receiving each of the switching control signals. Each of the second transistors may include a first terminal coupled to each of the ground voltage and the power supply voltages, a second terminal coupled to the second output node and a gate receiving each of the switching control signals. Each of the power supply voltages may have a different level from each other.

According to exemplary embodiments, a class-D amplifier includes, a duty signal generator, a level selection circuit, a driver and control block and an output stage. The duty signal generator outputs a duty signal having a pulse width corresponding to a level of an input signal by performing a pulse width modulation (PWM) on the input signal based on a triangular wave signal. The level selection circuit receives the input signal and configured to generate a level selection indicating a level to which the input signal belongs of a plurality of levels (multi-level) into which peak values of the input signal are divided. The driver and control block receives the duty signal, configured to generate switching control signals corresponding to the duty signal in response to the level selection signal, and configured to provide a selection signal to the duty signal generator. The output stage is connected to a ground voltage and a plurality of power supply voltages, and the output stage drives output nodes with at least two of the ground voltage and the power supply voltages in response to the switching control signals. The duty signal generator performs the PWM by chaining a modulation scheme in response to the selection signal when the input signal crosses each level boundary of the multi-level.

According to exemplary embodiments, an audio processing apparatus includes a volume control unit and a class-D amplifier. The volume control unit volume-controls audio source data in response to a volume control signal to provide an input signal. The class-D amplifier converts the input signal to a duty signal having multi-level and drives output nodes to be connected to a load based on the duty signal.

In exemplary embodiments, the class-D amplifier may include an error amplification circuit, a duty signal generator, a level selection circuit, a driver and control block and an output stage. The error amplification circuit may output an error signal by amplifying a difference between the input signal and an output signal. The duty signal generator outputs the duty signal having a pulse width corresponding to a level of the error signal by performing a pulse width modulation (PWM) on the error signal based on a triangular wave signal. The level selection circuit may receive the error signal and may generate a level selection signal indicating a level to which the error signal belongs of a plurality of levels (multi-level) into which peak values of the error signal are divided. The driver and control block may receive the duty signal, may generate switching control signals corresponding to the duty signal in response to the level selection signal, and may provide a selection signal to the duty signal generator. The output stage may be connected to a ground voltage and a plurality of power supply voltages, and the output stage may drive output nodes with at least two of the ground voltage and the power supply voltages in response to the switching control signals. The duty signal generator may perform the PWM by chaining a modulation scheme in response to the selection signal when the error signal crosses each level boundary of the multi-level.

A method of driving a class-D amplifier includes generating an error signal by amplifying a difference between an input signal and an output signal, generating a duty signal having a pulse width corresponding to a level of the error signal by performing a pulse width modulation (PWM) on the error signal based on a triangular wave signal, receiving the error signal to generate a level selection indicating a level to which the error signal belongs of a plurality of levels (multi-level), receiving the duty signal to generate switching control signals corresponding to the duty signal in response to the level selection signal, and driving an output node with at least two voltage of a ground voltage and a plurality of power supply voltages in response to the switching control signals. The PWM is performed by chaining a modulation scheme in response to the selection signal when the error signal crosses each level boundary of the multi-level.

Accordingly, a class-D amplifier divides peal levels of an error signal into multi-level and changes a scheme for modulating the error signal when the error signal crosses each level boundary of the multi-level thereby to have an effect such as the error signal is folded. Therefore, the class-D amplifier drives output nodes with multi-level and thus the class-D amplifier may increasing efficiency while reducing EMI.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Figure 1A:
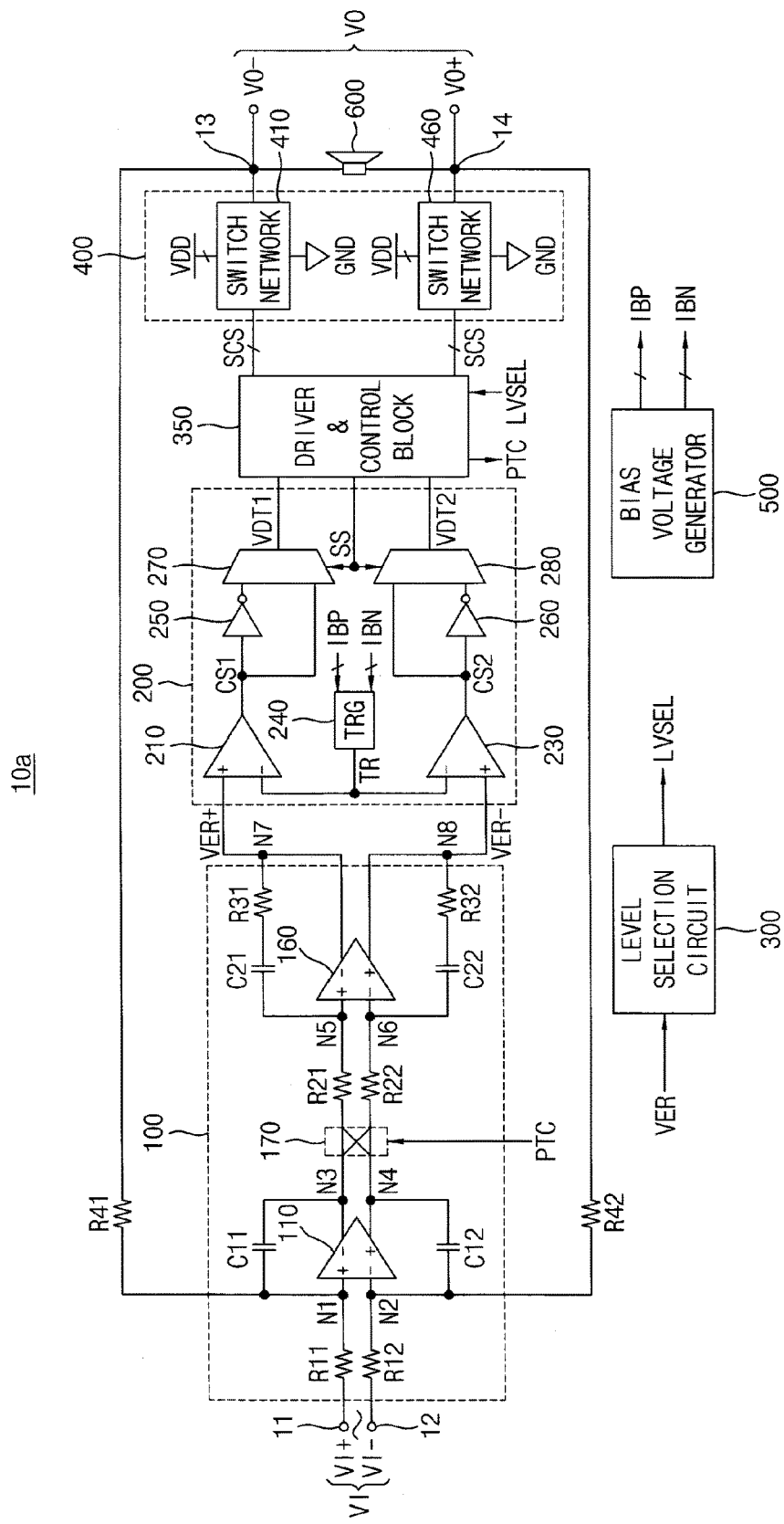
FIG. 1A is a circuit diagram illustrating a class-D amplifier according to exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a circuit diagram illustrating a class-D amplifier according to exemplary embodiments.

Referring to FIG. 1A, a class-D amplifier 10a includes an error amplification circuit 100, a duty signal generator 200, a level selection circuit 300, a driver and control block 350 and an output stage 400. The class-D amplifier 10a may further include a bias voltage generator 500.

The error amplification circuit may output an error signal VER by amplifying a difference between an input signal VI and an output signal VO which is fed back from output nodes 13 and 14. The duty signal generator 200 may output a duty signal VDT having a pulse width corresponding to a level of the error signal VER by performing a pulse width modulation (PWM) on the error signal VER based on a triangular wave signal TR. The level selection circuit 300 may receive the error signal VER and may generate a level selection LVSEL indicating a level to which the error signal VER belongs of a plurality of levels (multi-level) into which peak values of the error signal VER are divided.

The driver and control block 350 may receive the duty signal VDT, and may generate switching control signals SCS corresponding to the duty signal VDT in response to the level selection signal LVSEL, and may provide a selection signal SS to the duty signal generator 200. The output stage 400 is connected to a ground voltage GND and a plurality of power supply voltages VDD. The output stage 400 may drive the output nodes 13 and 14 with at least two voltages of the ground voltage GND the power supply voltages VDD in response to the switching control signals SCS. The duty signal generator 200 may perform the PWM by chaining a modulation scheme in response to the selection signal SS when the error signal VER crosses each level boundary of the multi-level.

The input signal VI may include differential input signal pair VI+ and VI−, the output signal VO may include differential output signal pair VO+ and VO−, and the duty signal VDT may include duty signal pair VDT1 and VDT2.

The error amplification circuit 100 may receive the differential input signal pair VI+ and VI− via input nodes 11 and 12. The error amplification circuit 100 may include a first differential amplifier 110, a second differential amplifier 160, a path selection unit 170, resistors R11, R12, R21, R22, R31 and R32 and capacitors C11, C12, C21 and C22.

The first differential amplifier 110 may include a first (positive) input terminal coupled to a node N1, a second (negative) input terminal coupled to a node N2, a first (negative) output terminal coupled to a node N3 and a second (positive) output terminal coupled to a node N4. The input node 11 is coupled to the node N1 through the resistor R11, and the capacitor C11 is coupled between the nodes N1 and N3. The input node 12 is coupled to the node N2 through the resistor R12, and the capacitor C12 is coupled between the nodes N2 and N4.

The second differential amplifier 160 may include a first (positive) input terminal coupled to a node N5, a second (negative) input terminal coupled to a node N6, a first (negative) output terminal coupled to a node N7 and a second (positive) output terminal coupled to a node N8. The path selection unit 170 is coupled to the node N5 through the resistor R21, and the capacitor C21 and the resistor R31 are coupled between the nodes N5 and N7. The path selection unit 170 is coupled to the node N6 through the resistor R22, and the capacitor C22 and the resistor R32 are coupled between the nodes N6 and N8.

The node N1 is coupled to the output node 13 through the resistors R41 and the output signal VO− is provided to the node N1. The node N2 is coupled to the output node 14 through the resistors R42 and the output signal VO+ is provided to the node N2. The first differential amplifier 110 amplifies a difference between the input signal VI and the output signal VO and the second differential amplifier 160 amplifies an output of the first differential amplifier 110 to output the error signal VER.

The path selection unit 170 may connect the output of the first differential amplifier 110 to an input of the second differential amplifier 160 by selecting one of a first path in a straight-forward direction and a second path in a diagonal direction in response to a path control signal PTC. The path selection unit 170 may connect the first and output terminals of the first differential amplifier 110 to the first and second input terminals of the second differential amplifier 160 respectively or may connect the first and output terminals of the first differential amplifier 110 to the second and first input terminals of the second differential amplifier 160 respectively, in response to the path control signal PTC.

The duty signal generator 200 may include a first comparator 210, a second comparator 230, a triangular wave generator 240, a first inverter 250, a second inverter 260, a first multiplexer 270 and a second multiplexer 280.

The first comparator 210 may compare a first component of the error signal VER, i.e., a first error signal VER+ with the triangular wave signal TR to output a first comparison signal CS1 having a pulse width corresponding a difference between the first error signal VER+ and the triangular wave signal TR. The second comparator 220 may compare a second component of the error signal VER, i.e., a second error signal VER− with the triangular wave signal TR to output a second comparison signal CS2 having a pulse width corresponding a difference between the second error signal VER− and the triangular wave signal TR.

Therefore, the first comparator 210 and the triangular wave generator 240 performs the PWM on the first error signal VER+ to output the first comparison signal CS1 having a high level while the first error signal VER+ is greater than the triangular wave signal TR. The first comparator 230 and the triangular wave generator 240 performs the PWM on the second error signal VER− to output the second comparison signal CS2 having a high level while the second error signal VER− is greater than the triangular wave signal TR.

The first inverter 250 may invert the first comparison signal CS1 and the second inverter 260 may invert the second comparison signal CS2. The first multiplexer 270 may select one of the first comparison signal CS1 and an output of the first inverter 250 in response to the selection signal SS to provide a first duty component, i.e., a first duty signal VDT1 of the duty signal VDT. The second multiplexer 280 may select one of the second comparison signal CS2 and an output of the second inverter 260 in response to the selection signal SS to provide a second duty component, i.e., a second duty signal VDT2 of the duty signal VDT.

The triangular wave generator 240 may generate the triangular wave signal TR to the first comparator 210 and the second comparator 230, based on bias voltages IBP and IBN.

The output stage 400 may include a first switch network 410 and a second switch network 460. The first switch network 410 may be coupled to the output node 13 and the first switch network 410 may drive the output node 13 with at least two voltages of the ground voltage and the power supply voltages VDD in response to switching control signals SCS. The second switch network 460 may be coupled to the output node 14 and the second switch network 460 may drive the output node 14 with at least two voltages of the ground voltage and the power supply voltages VDD in response to switching control signals SCS.

A load, or a speaker 600 is coupled between the output nodes 13 and 14, a first component of the output signal VO, i.e., a first output signal VO− is provided at the output node 13 and a second component of the output signal VO, i.e., a second output signal VO+ is provided at the output node 14.

The level selection circuit 300 monitors a level of the error signal VER and provides the driver and control block 350 with the level selection signal LVSEL that indicates a level to which the error signal VER belongs of the multi-level into which peak values of the error signal VER are divided and whether the error signal VER crosses each level boundary of the multi-level. The driver and control block 350 provides the selection signal SS to the first and second multiplexers 270 and 280 to change outputs of the first and second multiplexers 270 and 280 by changing a logic level of the selection signal SS when the error signal VER crosses each level boundary of the multi-level.

The bias voltage generator 500 generates the bias voltages IBP and IBN to the triangular wave generator 240.

Figure 1B:
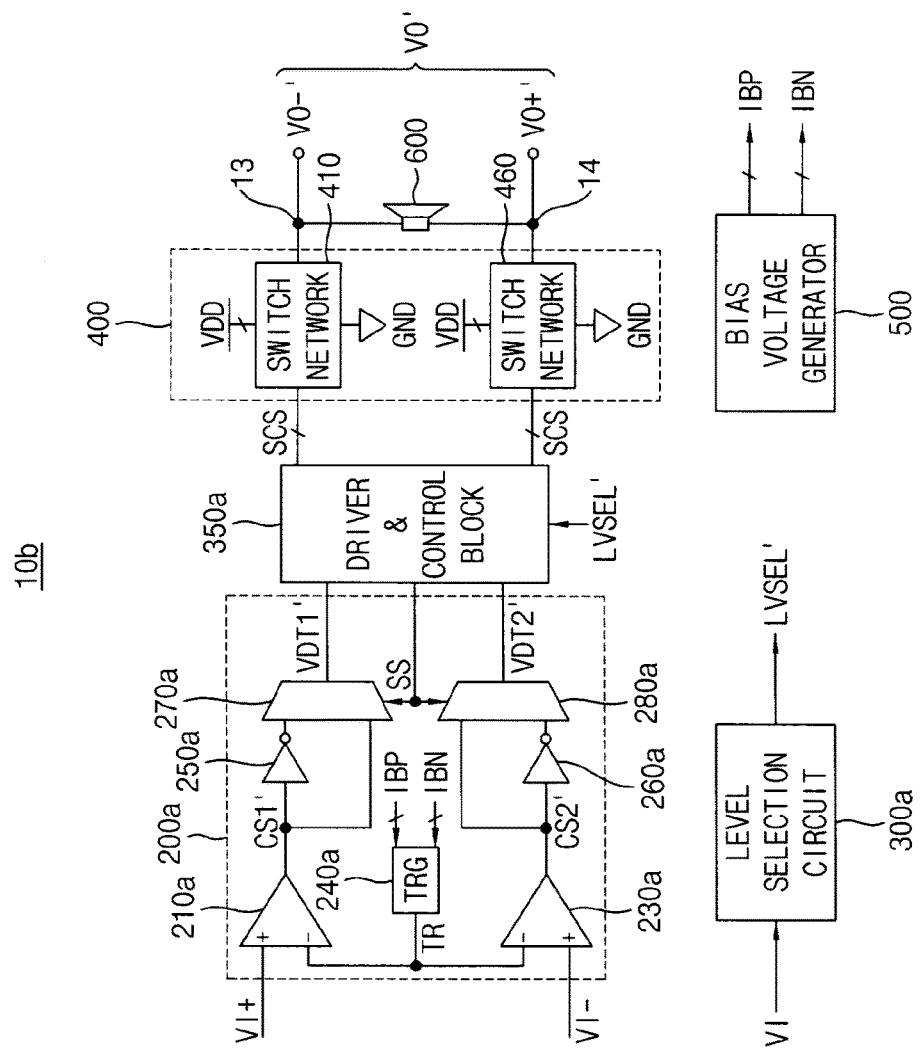
FIG. 1B is a circuit diagram illustrating a class-D amplifier according to exemplary embodiments.
Figure 2:
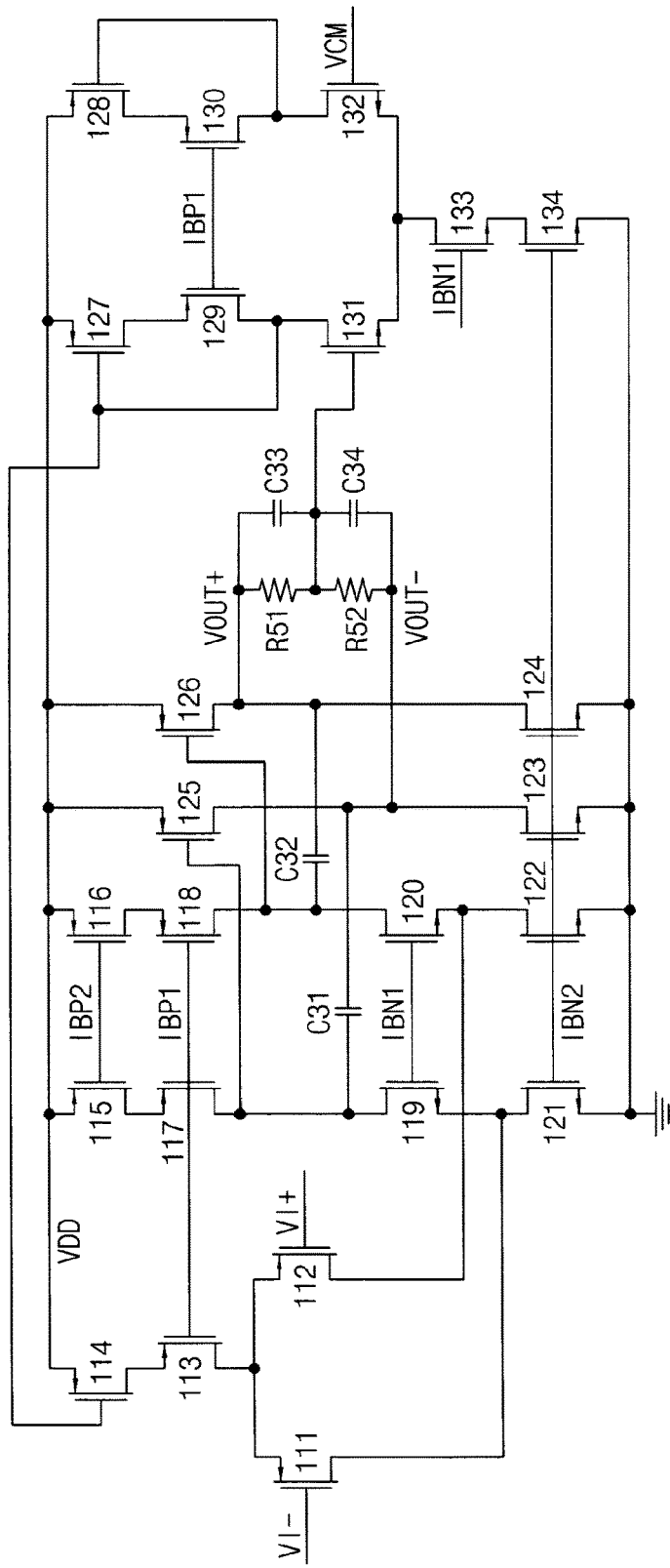
FIG. 2 is a circuit diagram illustrating the first differential amplifier in the class-D amplifier of FIG. 1 according to exemplary embodiments.

FIG. 2 is a circuit diagram illustrating the first differential amplifier in the class-D amplifier of FIG. 1 according to exemplary embodiments.

Referring to FIG. 2, the first differential amplifier 110 includes transistors 111~134, resistors R51 and R52 and capacitors C31, C32, C33 and C34.

The transistors 111~134, the resistors R51 and R52 and the capacitors C31, C32, C33 and C34 are connected as illustrated in FIG. 2.

The first input signal VI+ is applied to a gate of the transistor 111, and the second input signal VI− is applied to a gate of the transistor 112. A bias voltage IBP2 is applied to gates of the transistors 115 and 116, a bias voltage IBP1 is applied to gates of the transistors 117 and 118, a bias voltage IBN1 is applied to gates of the transistors 119 and 120, and a bias voltage IBN2 is applied to gates of the transistors 121 and 122.

In addition, the bias IBP1 is applied to gates of the transistors 129 and 130, a common mode voltage VCM is applied to a gate of the transistor 133, the bias voltage IBN1 is applied to a gate of the transistor 133. Each first terminal of the transistors 114, 115, 116, 127 and 128 is coupled to a power supply voltage VDD and each second terminal of the transistors 114, 115, 116, 127 and 128 is coupled to the ground voltage.

A first output VOUT+ of the first differential amplifier 110 may be provided at a node at which the resistor R51 and the capacitor C33 are commonly coupled and a second output VOUT− of the first differential amplifier 110 may be provided at a node at which the resistor R52 and the capacitor C34 are commonly coupled.

Configuration of the second differential amplifier 160 may be substantially the same as the configuration of the first differential amplifier 110.

Figure 3:
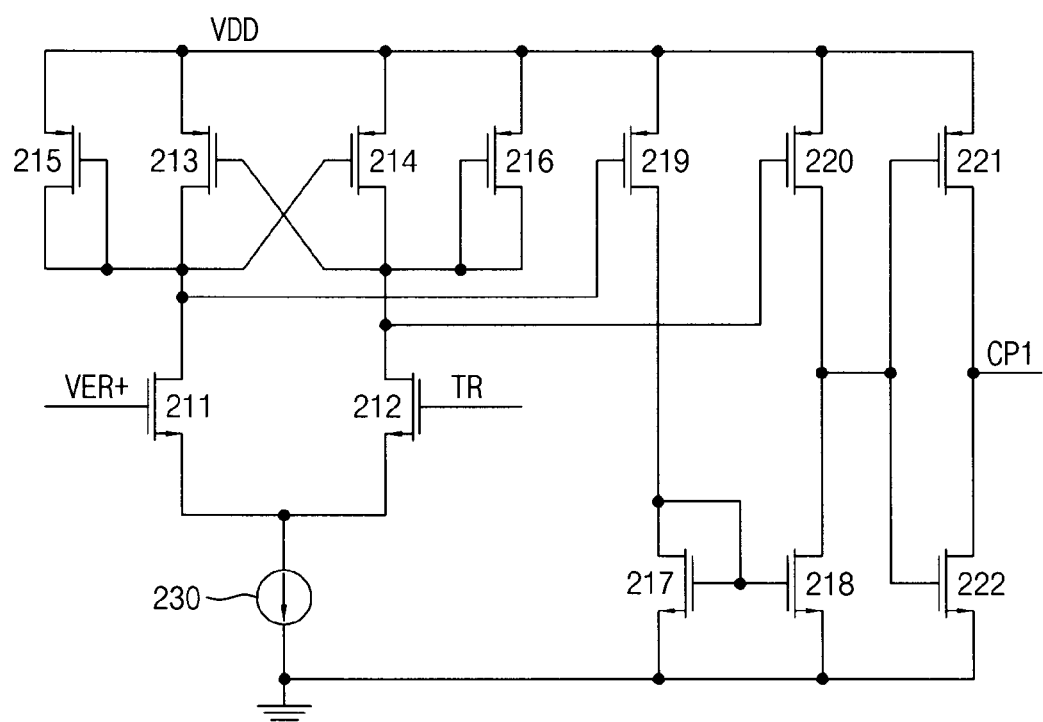
FIG. 3 is a circuit diagram illustrating the first comparator in the class-D amplifier of FIG. 1 according to exemplary embodiments.

FIG. 3 is a circuit diagram illustrating the first comparator in the class-D amplifier of FIG. 1 according to exemplary embodiments.

Referring to FIG. 3, the first comparator 210 includes PMOS transistors 213~216 and 219~221, NMOS transistors 211, 212, 217, 218, 222 and a current source 230.

The PMOS transistors 213~216 and 219~221, the NMOS transistors 211, 212, 217, 218, 222 and the current source 230 are connected as illustrated in FIG. 3.

Each first terminal of the PMOS transistors 213~216 and 219~221 is coupled to a power supply voltage VDD and each second terminal of the NMOS transistors 211, 212, 217, 218, 222 is coupled to the ground voltage.

The first error signal VER+ is applied to a gate of the NMOS transistor 211, the triangular wave signal TR is applied to a gate of the NMOS transistor 212, and the first comparison signal CS1 is provided at a node to which the transistors 221 and 222 are commonly coupled.

Configuration of the second comparator 230 may be substantially the same as the configuration of the first comparator 210.

Figure 4:
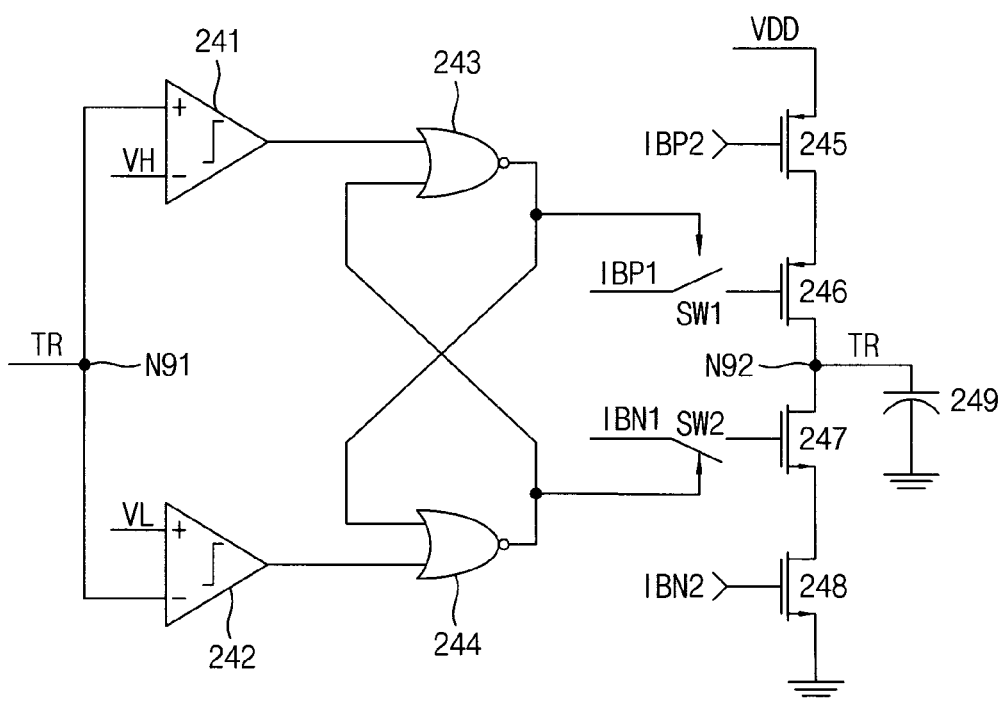
FIG. 4 is a circuit diagram illustrating the triangular wave generator in the class-D amplifier of FIG. 1 according to exemplary embodiments.

FIG. 4 is a circuit diagram illustrating the triangular wave generator in the class-D amplifier of FIG. 1 according to exemplary embodiments.

Referring to FIG. 4, the triangular wave generator 240 includes a first comparator 241, a second comparator 242, a first NOR gate 243, a second NOR gate 244, PMOS transistors 245 and 246, NMOS transistors 247 and 248, switches SW1 and SW2 and a capacitor 249.

The first comparator 241 compares the triangular wave signal TR input to a node N91 with a high reference voltage VH. The second comparator 242 compares the triangular wave signal TR with a low reference voltage VL. The first NOR gate 243 performs a NOR operation on an output of the first comparator 241 and an output of the second NOR gate 244. The second NOR gate 244 performs a NOR operation on an output of the second comparator 242 and an output of the first NOR gate 243.

The PMOS transistor 245 is coupled between the power supply voltage VDD and the PMOS transistor 246 and has a gate receiving the bias voltage IBP2. The PMOS transistor 246 is coupled between the PMOS transistor 246 and a node N92 and a has a gate coupled to the switch SW1. The switch SW1 provides selectively the bias voltage IBP1 to the gate of the PMOS transistor 246 in response to the output of the first NOR gate 243. The NMOS transistor 247 is coupled between the node N92 and the NMOS transistor 248 and a has a gate coupled to the switch SW2. The switch SW2 provides selectively the bias voltage IBN1 to the gate of the NMOS transistor 247 in response to the output of the second NOR gate 244. The NMOS transistor 248 is coupled to the NMOS transistor 247 and the ground voltage and has a gate receiving the bias voltage IBN2. The capacitor 249 stores the triangular wave signal TR provided at the node N92.

Figure 5:
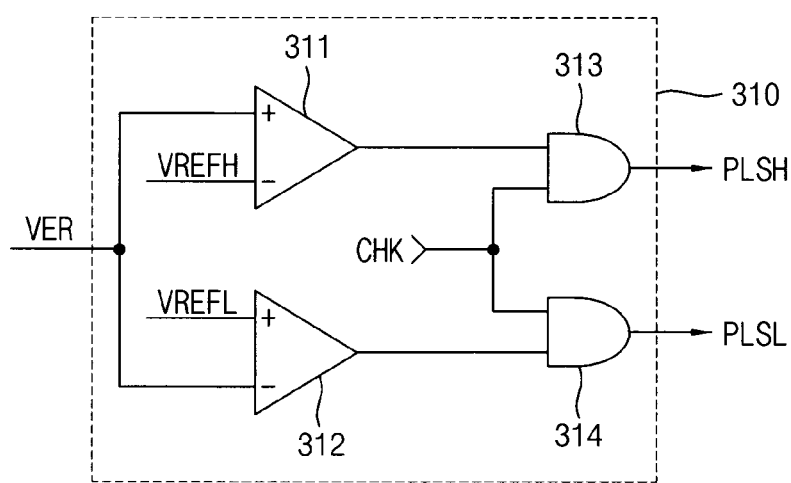
FIG. 5 is a circuit diagram illustrating the level selection circuit in the class-D amplifier of FIG. 1 according to exemplary embodiments.
Figure 5:
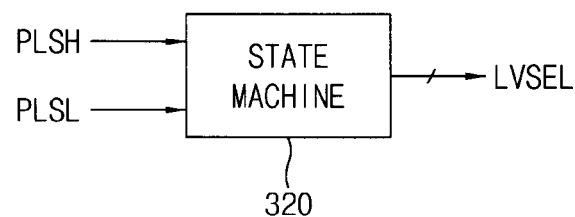

FIG. 5 is a circuit diagram illustrating the level selection circuit in the class-D amplifier of FIG. 1 according to exemplary embodiments.

Referring to FIG. 5, the level selection circuit 300 may include a pulse generator 310 and a state machine 320.

The pulse generator 310 may generate a first pulse signal PLSH and a second pulse signal PLSL based on the error signal VER, a first reference voltage VREFH and a second reference voltage VREFL. The state machine 320 may generate the level selection signal LVSEL in response to the first pulse signal PLSH and the second pulse signal PLSL.

The pulse generator 310 may include a first comparator 311, a second comparator 312, a first AND gate 313 and a second AND gate 314.

The first comparator 311 compares the error signal VER and the first reference voltage VREFH to output a signal having a high level when the error signal VER is greater than the first reference voltage VREFH. The first AND gate 313 performs an AND operation on an output of the first comparator 311 and a check signal CHK to provide the first pulse signal PLSH. Therefore, the first pulse signal PLSH may be same as the output of the first comparator 311 while the check signal CHK is at a high level.

The second comparator 312 compares the error signal VER and the second reference voltage VREFL to output a signal having a high level when the second reference voltage is greater than the error signal VER. The second AND gate 314 performs an AND operation on an output of the second comparator 312 and the check signal CHK to provide the second pulse signal PLSL. Therefore, the second pulse signal PLSL may be same as the output of the second comparator 312 while the check signal CHK is at a high level. The check signal CHK check a current state to prevent malfunction due to unintended folding.

Figure 6:
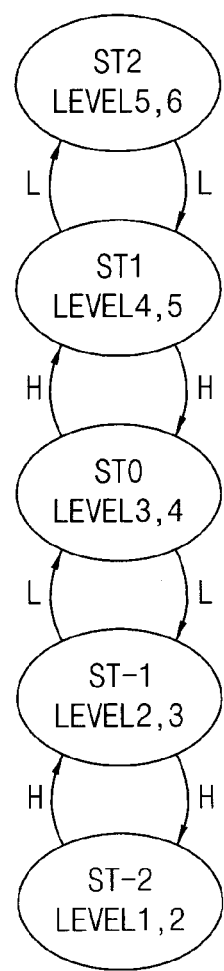
FIG. 6 is diagram illustrating operation of the state machine in FIG. 5.

FIG. 6 is diagram illustrating operation of the state machine in FIG. 5.

Referring to FIG. 6, the state machine 320 operates in one of a plurality states ST-2~ST2, and transits to another state of the plurality states ST-2~ST2 according to logic levels of the first and second pulse signals PLSH and PLSL when the error signal VER crosses each level boundary. It is assumed that the state machine 320 operates in the state ST0 when the error signal VER belongs to one of the multi-level.

When the state machine 320 operates in the state ST0 and the error signal VER transits to an upper level to cross each level boundary, the first pulse signal PLSH transits to a high level. The level selection signal LVSEL indicating that the first pulse signal PLSH transits to a high level is applied to the driver and control block 350 in response to the first pulse signal PLSH having a high level. The driver and control block 350 provides the switching control signal SCS to the output stage 400 and provides the selection signal SS to the first and second multiplexers 270 and 280.

The first and second switch networks 410 and 460 in the output stage 400 drives the output nodes 13 and 14 with voltages designated by the state ST1, of the plurality of voltages in response to the switching control signal SCS. The first and second multiplexers 270 and 280 output signals different from signals which are output in the state ST0.

In FIG. 6, the first pulse signal PLSH designates a transition from a lower state to a higher state and the second pulse signal PLSL designates a transition from a higher state to a lower state. In FIG. 6, the state ST-2 is lowest state and the state ST2 is highest state.

Figure 7:
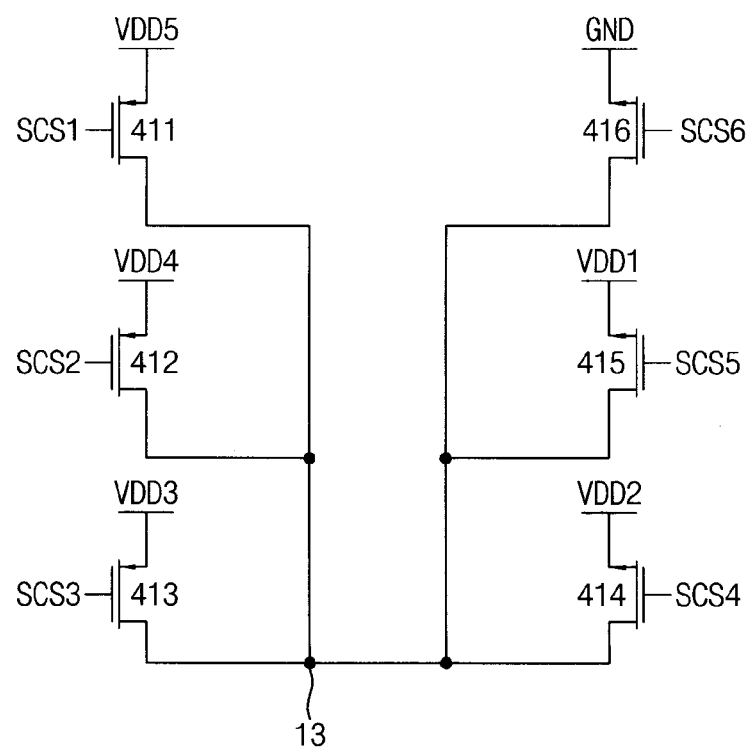
FIG. 7 is a circuit diagram illustrating the first switch network in the class-D amplifier of FIG. 1 according to exemplary embodiments.

FIG. 7 is a circuit diagram illustrating the first switch network in the class-D amplifier of FIG. 1 according to exemplary embodiments.

Referring to FIG. 7, the first switch network 410 includes PMOS transistors 411~413 and NMOS transistors 414~416.

Each first terminal of the PMOS transistors 411~413 is coupled to each of power supply voltages VDD5, VDD4 and VDD3 and each second terminal of the PMOS transistors 411~413 is coupled to the output node 13. Each first terminal of the NMOS transistors 414~416 is coupled to power supply voltages VDD2 and VDD1 and the ground voltage GND and each second terminal of the NMOS transistors 414~416 is coupled to the output node 13.

The power supply voltages VDD1~VDD5 have different levels with one another and are higher than the ground voltage GND. Relationship of the power supply voltages VDD1~VDD5 may be VDD1<VDD2<VDD3<VDD4<VDD5.

Switching control signals SCS1~SCS6 may be applied to each gate of the PMOS transistors 411~413 and the NMOS transistors 414~416. The switching control signals SCS1~SCS6 may have levels such that voltages designated by one of the states (ST-2~ST2) of FIG. 6 are used according to a level to which the error signal VER belongs. For example, when the current state corresponds to the state ST0, the switching control signal SCS3 has a low level and the switching control signal SCS4 has a high level such that the output node 13 is driven with the power supply voltages VDD3 and VDD2.

Figure 8A:
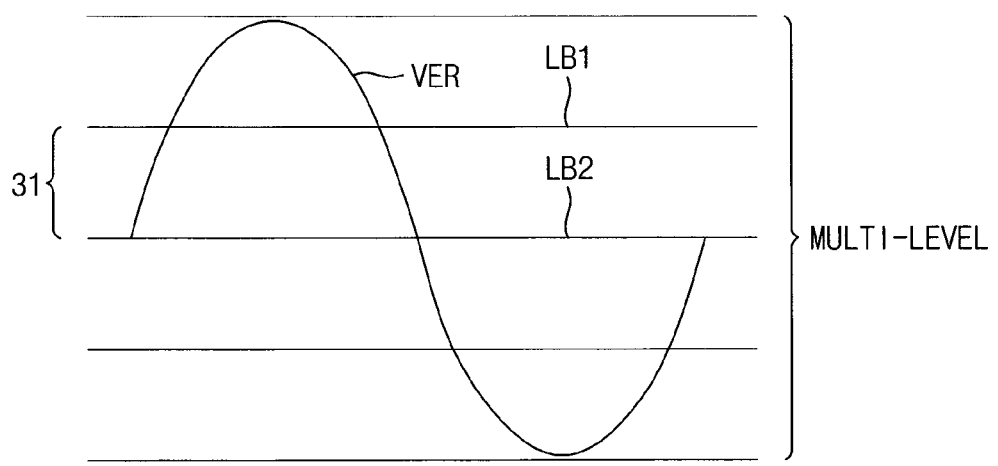
FIGS. 8A through 8C are diagrams for explaining a concept of multi-level.
Figure 8B:
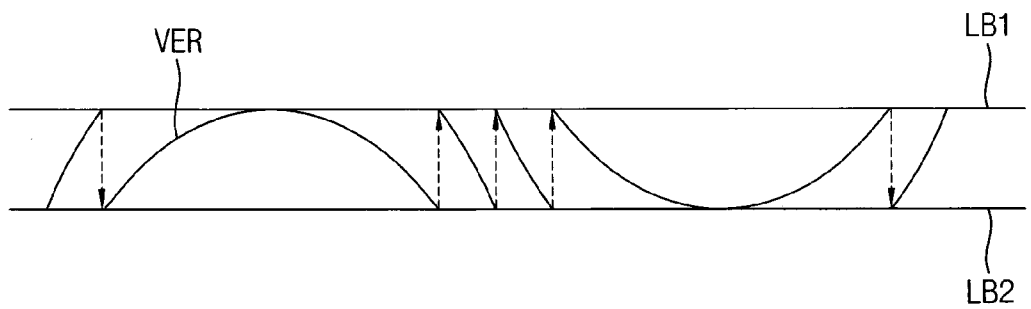
Figure 8C:
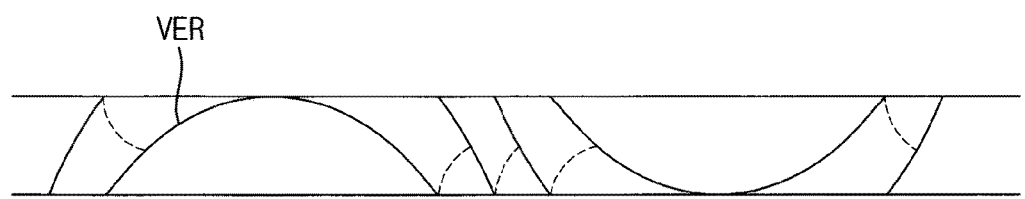

FIGS. 8A through 8C are diagrams for explaining a concept of multi-level.

FIG. 8A shows that a level of the error signal VER is divided into a plurality of levels 31 (multi-level) between upper and lower peak values of the error signal VER.

FIG. 8B shows that a shifting occurs in a direct current (DC) voltages corresponding to the error signal VER when the error signal VER crosses each of level boundaries LB1 and LB2 of the multi-level.

FIG. 8C shows that a distortion occurs in a real waveform of the error signal VER as indicated by a dotted line.

Figure 9:
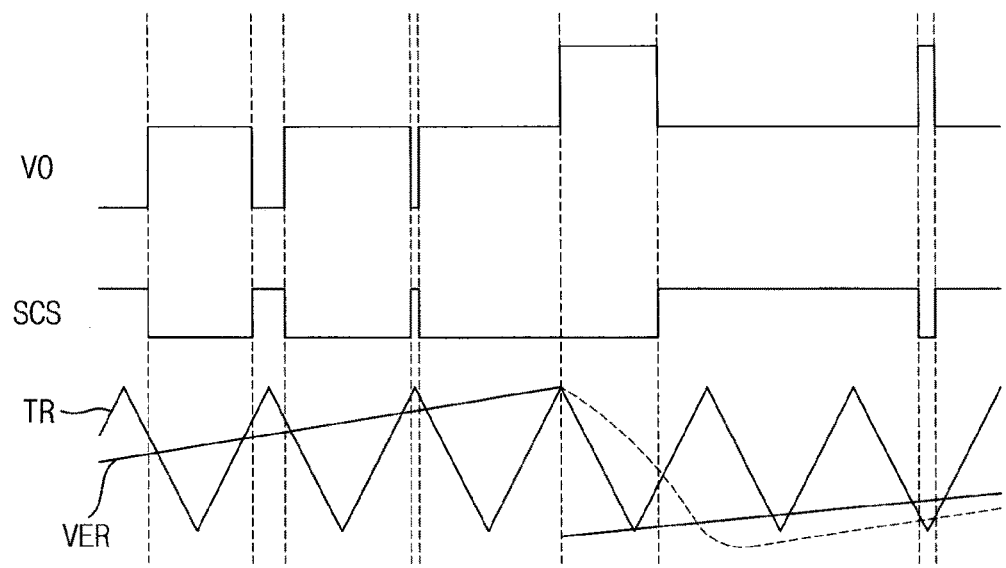
FIG. 9 illustrates various signals in the conventional class-D amplifier.

FIG. 9 illustrates various signals in the conventional class-D amplifier.

In FIG. 9, an output signal VO, a switching control signal SCS, a triangular wave signal TR and the error signal VER are illustrated. In FIG. 9, solid portion of the error signal VER denotes ideal waveform and dotted portion of the error signal VER denotes real waveform.

It is noted that errors occur due to shifting when the error signal VER crosses the level boundaries LB1 and LB2 as in FIG. 8C.

Figure 10:
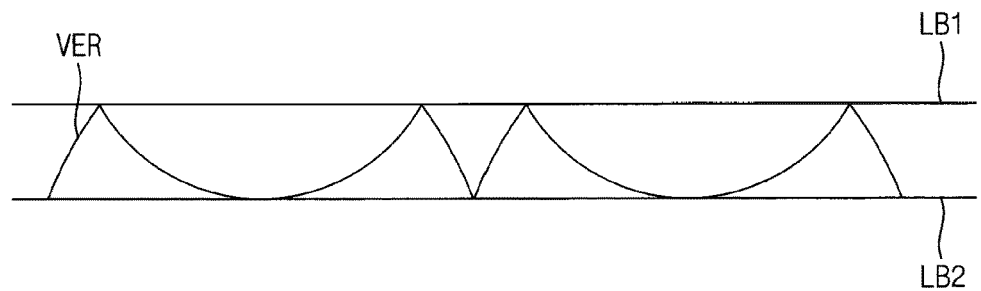
FIG. 10 is a diagram illustrating the present inventive concept.

FIG. 10 is a diagram illustrating the present inventive concept.

Referring to FIG. 10, shifting does not occur in the DC voltage corresponding to the error signal VER by folding the error signal VER when the error signal VER crosses the level boundaries LB1 and LB2.

Figure 11:
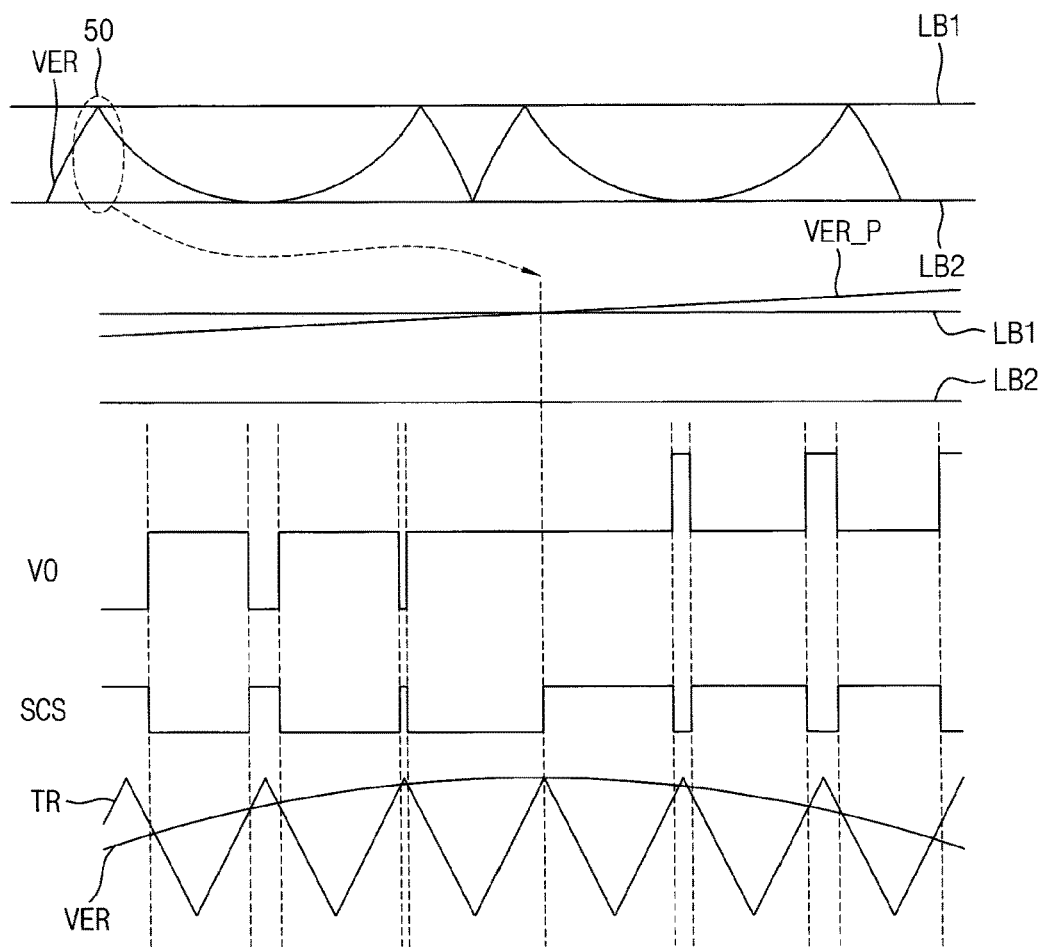
FIG. 11 illustrates various signals in the class-D amplifier of FIG. 1A according to exemplary embodiments.

FIG. 11 illustrates various signals in the class-D amplifier of FIG. 1A according to exemplary embodiments.

Referring to FIG. 11, a portion 50 is enlarged as illustrated. When the error signal VER is folded when the error signal VER crosses the level boundary LB1, the switching control signal SCS is output according to a difference between the error signal VER and the triangular wave signal TR, and the output signal VO drives the output nodes 13 and 14 in response to the switching control signal SCS. In FIG. 11, a reference numeral VER_P indicates a case when the error signal VER is not folded.

Figure 12A:
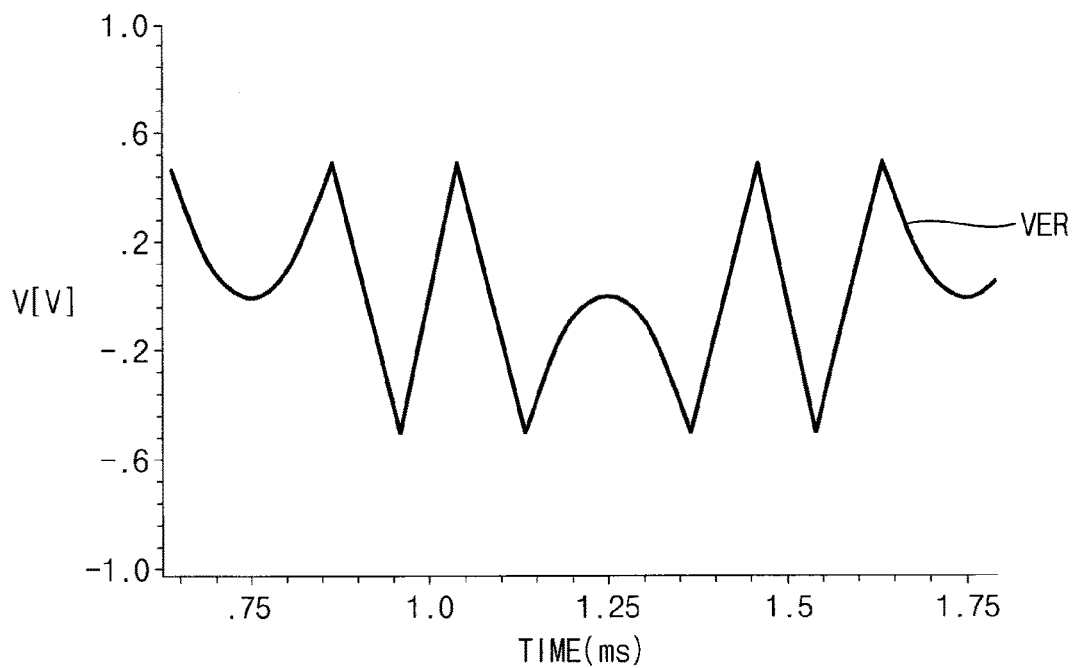
FIGS. 12A through 12C illustrate simulation results of the class-D amplifier of FIG. 1A according to exemplary embodiments.
Figure 12B:
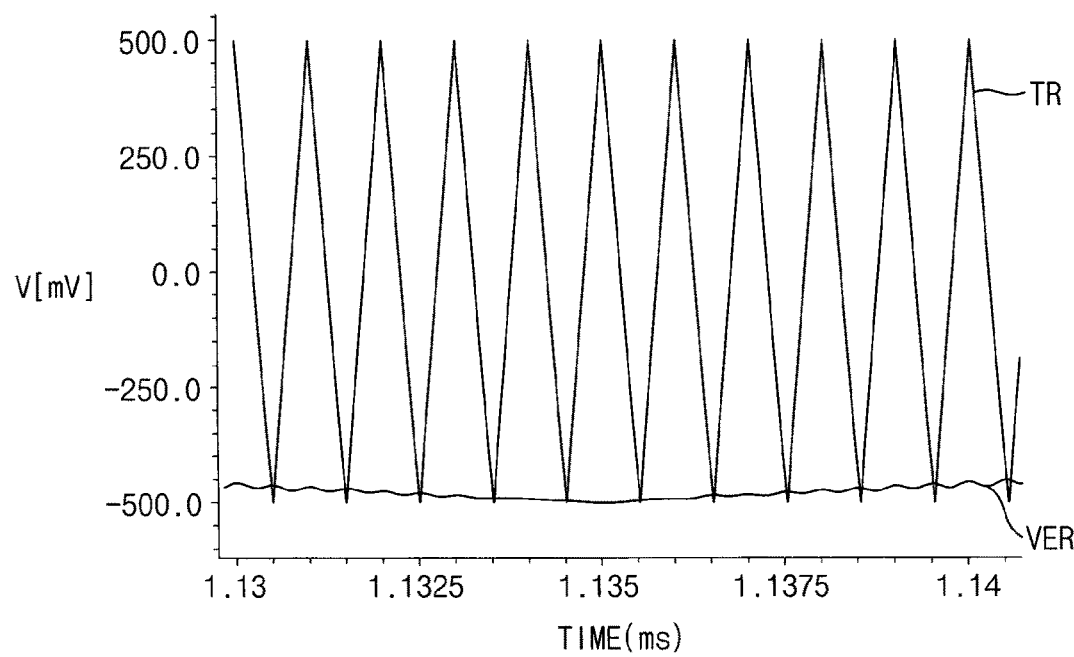
Figure 12C:
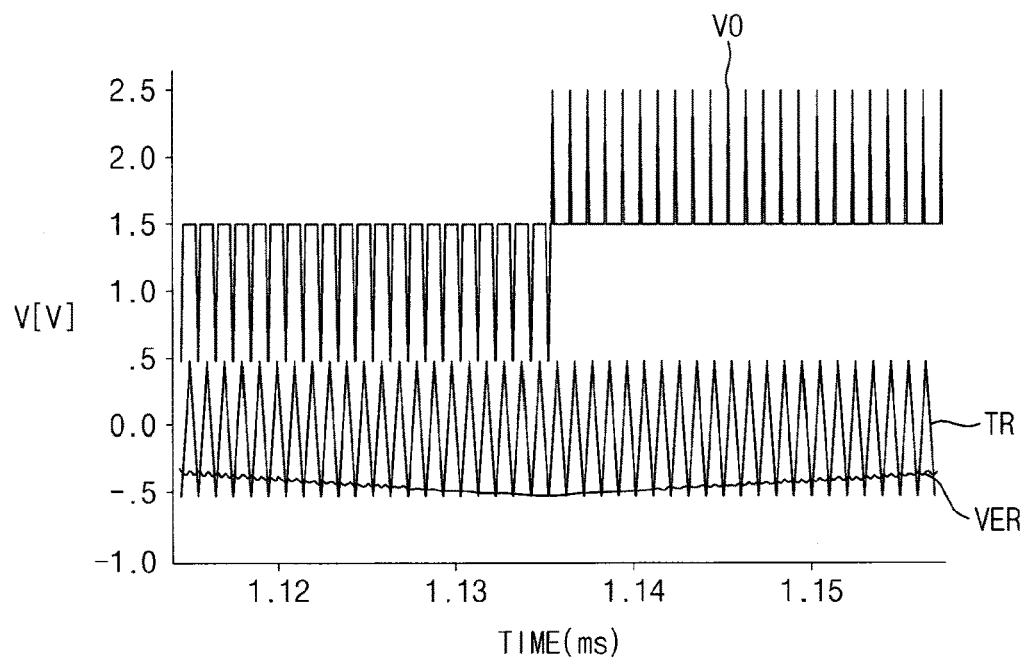

FIGS. 12A through 12C illustrate simulation results of the class-D amplifier of FIG. 1A according to exemplary embodiments.

Referring to FIGS. 12A through 12C, when the error signal VER is folded by changing a modulation scheme when the error signal VER crosses each level boundary, the output signal VO is provided at the output nodes 13 and 14 according to a difference between the error signal VER and the triangular wave signal TR.

In FIGS. 12A through 12C, the class-D amplifier 10a is simulated on condition that each of the resistors R11 and R12 has 100 kΩ, each of the capacitors C21 and C22 has 2 pF, each of the resistors R31 and R32 has 300 kΩ and each of the resistors R31 and R32 has 200 kΩ.

Figure 13:
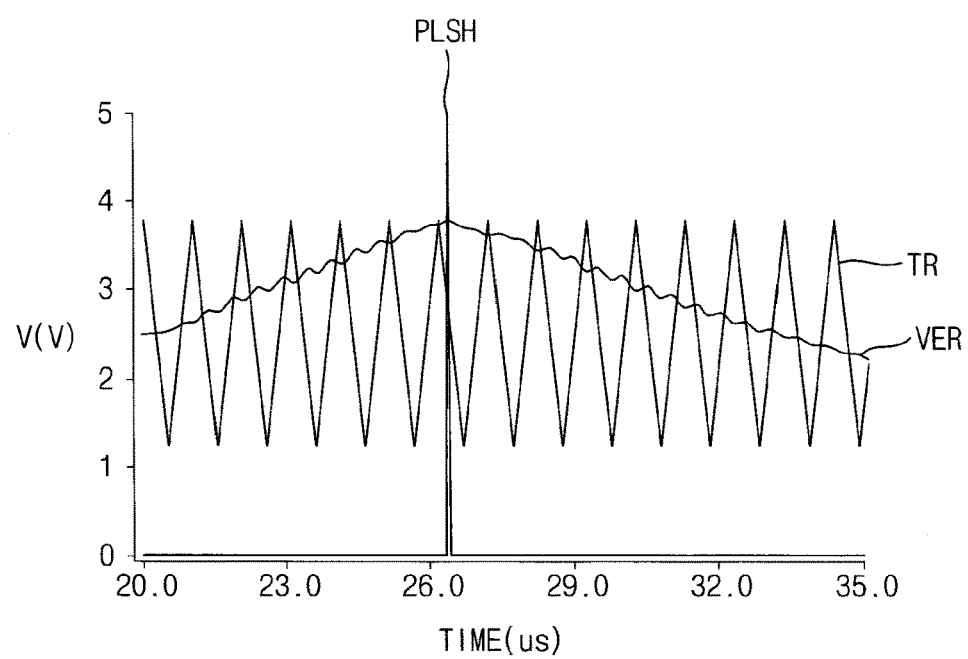
FIG. 13 illustrates state transition in the level selection circuit of FIG. 5 and the state machine of FIG. 6 in response to the first pules signal.

FIG. 13 illustrates state transition in the level selection circuit of FIG. 5 and the state machine of FIG. 6 in response to the first pules signal.

Referring to FIGS. 5, 6 and 13, a state transition may occur in respond to a logic level of the first pulse signal PLSH.

As described with reference to FIGS. 1A and 2 through 13, the class-D amplifier 10a divides the error signal VER into the multi-level and changes a scheme for modulating the error signal VER when the error signal VER crosses each level boundary of the multi-level thereby to have an effect such as the error signal VER is folded. Folding the error signal VER is performed by the level selection circuit 300, the inverters 250 and 260, the multiplexers 270 and 280 and the driver and control block 350. Therefore, the class-D amplifier 10a drives the output nodes 13 and 14 with multi-level and thus the class-D amplifier 10a may increasing efficiency while reducing EMI.

FIG. 1B is a circuit diagram illustrating a class-D amplifier according to exemplary embodiments.

Referring to FIG. 1B, a class-D amplifier 10b includes a duty signal generator 200a, a level selection circuit 300a, a driver and control block 350a and an output stage 400. The class-D amplifier 10b may further include a bias voltage generator 500.

The duty signal generator 200a may output a duty signal VDT' having a pulse width corresponding to a level of an input signal VI by performing a pulse width modulation (PWM) on the input signal VI based on a triangular wave signal TR. The level selection circuit 300a may receive the input signal VI and may generate a level selection LVSEL' indicating a level to which the input signal VI belongs of a plurality of levels (multi-level) into which peak values of the input signal VI are divided.

The driver and control block 350a may receive the duty signal VDT', and may generate switching control signals SCS corresponding to the duty signal VDT' in response to the level selection signal LVSEL', and may provide a selection signal SS to the duty signal generator 200a. The output stage 400 is connected to a ground voltage GND and a plurality of power supply voltages VDD. The output stage 400 may drive the output nodes 13 and 14 at which an output signal VO' is provided with at least two voltages of the ground voltage GND the power supply voltages VDD in response to the switching control signals SCS. The duty signal generator 200a may perform the PWM by chaining a modulation scheme in response to the selection signal SS when the input signal VI crosses each level boundary of the multi-level.

The input signal VI may include differential input signal pair VI+ and VI−, the output signal VO' may include differential output signal pair VO+' and VO−', and the duty signal VDT may include duty signal pair VDT1' and VDT2'.

The duty signal generator 200a may include a first comparator 210a, a second comparator 230a, a triangular wave generator 240a, a first inverter 250a, a second inverter 260a, a first multiplexer 270a and a second multiplexer 280a.

The first comparator 210a may compare a first component of the input signal, i.e., a first input signal VI+ with the triangular wave signal TR to output a first comparison signal CS1' having a pulse width corresponding a difference between the first input signal VI+ and the triangular wave signal TR. The second comparator 220a may compare a second component of the input signal VI, i.e., a second input signal VI− with the triangular wave signal TR to output a second comparison signal CS2' having a pulse width corresponding a difference between the second input signal VI− and the triangular wave signal TR.

Therefore, the first comparator 210a and the triangular wave generator 240a performs the PWM on the first input signal VI+ to output the first comparison signal CS1' having a high level while the first input signal VI+ is greater than the triangular wave signal TR. The first comparator 230a and the triangular wave generator 240a performs the PWM on the second input signal VI– to output the second comparison signal CS2' having a high level while the second input signal VI– is greater than the triangular wave signal TR.

The first inverter 250a may invert the first comparison signal CS1' and the second inverter 260a may invert the second comparison signal CS2'. The first multiplexer 270a may select one of the first comparison signal CS1' and an output of the first inverter 250a in response to the selection signal SS to provide a first duty component of the duty signal VDT', i.e., a first duty signal VDT1'. The second multiplexer 280a may select one of the second comparison signal CS2' and an output of the second inverter 260a in response to the selection signal SS to provide a second duty component of the duty signal VDT', i.e., a second duty signal VDT2'.

The triangular wave generator 240 may generate the triangular wave signal TR to the first comparator 210a and the second comparator 230a, based on bias voltages IBP and IBN.

The output stage 400 may include a first switch network 410 and a second switch network 460. The first switch network 410 may be coupled to the output node 13 and the first switch network 410 may drive the output node 13 with at least two voltages of the ground voltage and the power supply voltages VDD in response to switching control signals SCS. The second switch network 460 may be coupled to the output node 14 and the second switch network 460 may drive the output node 14 with at least two voltages of the ground voltage and the power supply voltages VDD in response to switching control signals SCS.

A load, or a speaker 600 is coupled between the output nodes 13 and 14, a first component of the output signal VO', i.e., a first output signal VO–' is provided at the output node 13 and a second component of the output signal VO', i.e., a second output signal VO+' is provided at the output node 14.

The level selection circuit 300a monitors a level of the input signal VI and provides the driver and control block 350a with the level selection signal LVSEL' that indicates a level to which the input signal VI belongs of the multi-level into which peak values of the input signal VI are divided and whether the input signal VER crosses each level boundary of the multi-level. The driver and control block 350a provides the selection signal SS to the first and second multiplexers 270a and 280a to change outputs of the first and second multiplexers 270a and 280a by changing a logic level of the selection signal SS when the input signal VI crosses each level boundary of the multi-level.

The bias voltage generator 500 generates the bias voltages IBP and IBN to the triangular wave generator 240.

The class-D amplifier 10b of FIG. 1B different from the class-D amplifier 10a of FIG. 1A in that the class-D amplifier 10b does not include the error amplification circuit 100 and the input signal VI is provided to the duty signal generator 200a and the level selection circuit 300a instead of the error signal VER. Therefore, configuration and operation of the class-D amplifier 10b may be understood based on description with reference to FIGS. 1A, 3, 5, 6 8A through 8C, 10 and 11.

Referring to FIGS. 1A and 2 through 13, in a method of driving a class-D amplifier 10a, an error signal VER is generated by amplifying a difference between an input signal VI and an output signal VO, a duty signal VDT having a pulse width corresponding to a level of the error signal VER is generated by performing a pulse width modulation (PWM) on the error signal VER based on a triangular wave signal TR, the error signal VER is received to generate a level selection LVSEL indicating a level to which the error signal VER belongs of a plurality of levels (multi-level), the duty signal VDT is received to generate switching control signals SCS corresponding to the duty signal VDT in response to the level selection signal LVSEL, output nodes 13 and 14 with at least two voltage of a ground voltage GND and a plurality of power supply voltages VDD in response to the switching control signals SCS. The PWM is performed by chaining a modulation scheme in response to the selection signal SS when the error signal VER crosses each level boundary of the multi-level.

Figure 14:
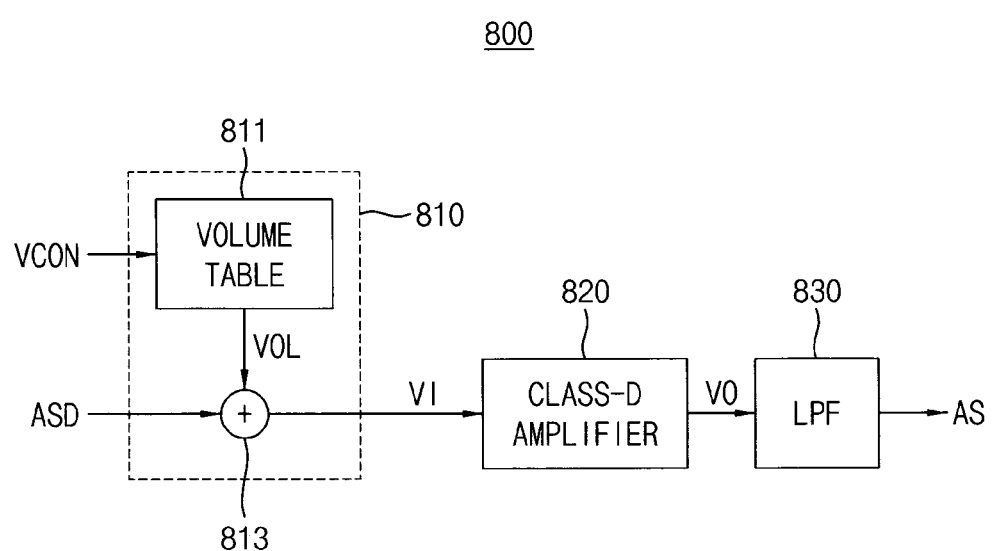
FIG. 14 is a block diagram of an audio processing apparatus according to another exemplary embodiment.

FIG. 14 is a block diagram of an audio processing apparatus according to another exemplary embodiment.

Referring to FIG. 14, an audio processing apparatus 800 includes a volume control unit 810 and a class-D amplifier 820. The class-D amplifier 820 may employ the class-D amplifier 10a of FIG. 1A. Therefore, the class-D amplifier 820 may include an error amplification circuit, a duty signal generator, a level selection circuit, a driver and control block, an output stage and a bias voltage generator.

The volume control unit 810 includes a volume table 811 and a multiplier 813. The volume table 811 outputs a volume value VOL in response to a received volume control signal VCON. The volume value VOL is a level control value for controlling the level of audio source data ASD. The audio source data ASD may be a pulse code modulation (PCM) data.

The volume table 811 stores a table for mapping the volume control signal VCON to the volume value VOL. When a user of the audio processing apparatus 800 controls the volume of an audio signal, the volume control signal VCON corresponding to the use's control may be generated. The volume control signal VCON is a digital code including a plurality of bits. For example, when the volume control signal VCON includes 4 bits, volume may be controlled at 16 levels.

The multiplier 813 multiplies the audio source data ASD by the volume value VOL and outputs volume-controlled input signal VI. Thus, the multiplier 813 amplifies or attenuates the level of the audio source data ASD according to the volume value VOL. When the volume value VOL is greater than 1 (0 dB), the level of the audio source data ASD is amplified. When the volume value VOL is less than 1 (0 dB), the level of the audio source data ASD is attenuated. By default, the volume value may be 1 (0 dB).

The audio source data ASD may be obtained by performing PCM on a digital signal resulting from sampling and digitizing an analog audio signal at a predetermined sampling rate (i.e., 48 kHz). Each sample of the digital audio source data ASD may be include a plurality of bits, e.g. 16 or 20 bits.

The class-D amplifier 820 generates an error signal by amplifying a difference between the input signal VI and the output signal VO, divides the error signal into the multi-level and changes a scheme for modulating the error signal when the error signal crosses each level boundary of the multi-level thereby to have an effect such as the error signal is folded. Therefore, the class-D amplifier 820 drives output nodes with multi-level and thus the class-D amplifier 820 may increasing efficiency while reducing EMI.

The output signal VO may be provided as an audio signal AS through a low-pass filter 830.

Exemplary embodiments may be applied to various electronic devices employing a class-D amplifier. For example, exemplary embodiments may be employed by a hand-held device such as a smart-phone and a tablet.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A class-D amplifier, comprising:
   an error amplification circuit configured to output an error signal by amplifying a difference between an input signal and an output signal;
   a duty signal generator configured to output a duty signal having a pulse width corresponding to a level of the error signal by performing a pulse width modulation (PWM) on the error signal based on a triangular wave signal;
   a level selection circuit configured to receive the error signal and configured to generate a level selection signal indicating a level to which the error signal belongs of a plurality of levels (multi-level) into which peak values of the error signal are divided;
   a driver and control block configured to receive the duty signal, configured to generate switching control signals corresponding to the duty signal in response to the level selection signal, and configured to provide a selection signal to the duty signal generator; and
   an output stage connected to a ground voltage and a plurality of power supply voltages, the output stage configured to drive output nodes with at least two of the ground voltage and the plurality of power supply voltages in response to the switching control signals, wherein the output signal is provided at the output nodes, and
   wherein the duty signal generator is configured to perform the PWM by chaining a modulation scheme in response to the selection signal when the error signal crosses each level boundary of the multi-level.

2. The class-D amplifier of claim 1, wherein the input signal is a differential analog signal and the output signal is digital.

3. The class-D amplifier of claim 1, wherein the error amplification circuit comprises:
   a first differential amplifier configured to receive the input signal through a first resistor coupled to a first node and a second resistor coupled to a second node, configured to receive the output signal through a third resistor coupled to the first node and a fourth resistor coupled to the second node, and configured to amplify the difference between the input signal and the output signal;
   a second differential amplifier configured to receive an output of the first differential amplifier through fifth and sixth resistors and configured to amplify the output of the first differential amplifier to output the error signal; and
   a path selection unit configured to connect the output of the first differential amplifier to an input of the second differential amplifier by selecting one of a first path in a straight-forward direction and a second path in a diagonal direction in response to a path control signal.

4. The class-D amplifier of claim 3, wherein the driver and control block is configured to provide the path control signal to the path selection unit based on the level selection signal.

5. The class-D amplifier of claim 1, wherein the duty signal generator comprises:
   a first comparator configured to compare a first component of the error signal with the triangular wave signal to output a first comparison signal;
   a second comparator configured to compare a second component of the error signal with the triangular wave signal to output a second comparison signal;
   a triangular wave generator configured to generate the triangular wave signal;
   a first inverter configured to invert the first comparison signal;
   a second inverter configured to invert the second comparison signal;
   a first multiplexer configured to select one of the first comparison signal and an output of the first inverter in response to the selection signal to provide a first duty component of the duty signal; and
   a second multiplexer configured to select one of the second comparison signal and an output of the second inverter in response to the selection signal to provide a second duty component of the duty signal.

6. The class-D amplifier of claim 5, wherein the driver and control block is configured to provide the selection signal to the first and second multiplexers to change outputs of the first and second multiplexers when the error signal crosses each level boundary of the multi-level.

7. The class-D amplifier of claim 1, further comprising:
   a bias voltage generator configured to generate a plurality of bias voltages to a triangular wave generator that generates the triangular wave signal.

8. The class-D amplifier of claim 1, wherein the level selection circuit comprises:
   a pulse generator configured to generate a first pulse signal and a second pulse signal based on the error signal, a first reference voltage and a second reference voltage; and
   a state machine configured to generate the level selection signal in response to the first pulse signal and the second pulse signal,
   wherein a level of the first reference voltage is higher than a level of the second reference voltage.

9. The class-D amplifier of claim 8, wherein the pulse generator comprises:
   a first comparator configured to compare the error signal and the first reference voltage;
   a second comparator configured to compare the error signal and the second reference voltage;
   a first AND gate configured to perform an AND operation on an output of the first comparator and a check signal to provide the first pulse signal; and
   a second AND gate configured to perform an AND operation on an output of the second comparator and the check signal to provide the second pulse signal.

10. The class-D amplifier of claim 8, wherein the state machine is configured to provide the driver and control block with the level selection signal based on logic levels of the first and second pulse signals, and wherein the level selection signal indicates one of a plurality of states using at least two voltages of the ground voltage and the plurality of power supply voltages and a transitions between the states.

11. The class-D amplifier of claim 1, wherein the output stage comprises:

a first switch network coupled to a first output node of the output nodes, the first switch network including first transistors connected in parallel between each of the ground voltage and the plurality of power supply voltages and the first output node; and a second switch network coupled to a second output node of the output nodes, the second switch network including second transistors connected in parallel between the ground voltage and the plurality of power supply voltages and the second output node.

12. The class-D amplifier of claim 11, wherein each of the first transistors includes a first terminal coupled to each of the ground voltage and the plurality of power supply voltages, a second terminal coupled to the first output node and a gate receiving each of the switching control signals, wherein each of the second transistors includes a first terminal coupled to each of the ground voltage and the plurality of power supply voltages, a second terminal coupled to the second output node and a gate receiving each of the switching control signals, and wherein each of the plurality of power supply voltages has a different level from each other.

13. A class-D amplifier, comprising:

a duty signal generator configured to output a duty signal having a pulse width corresponding to a level of an input signal by performing a pulse width modulation (PWM) on the input signal based on a triangular wave signal;

a level selection circuit configured to receive the input signal and configured to generate a level selection indicating a level to which the input signal belongs of a plurality of levels (multi-level) into which peak values of the input signal are divided;

a driver and control block configured to receive the duty signal, configured to generate switching control signals corresponding to the duty signal in response to the level selection signal, and configured to provide a selection signal to the duty signal generator; and an output stage connected to a ground voltage and a plurality of power supply voltages, the output stage configured to drive output nodes with at least two of the ground voltage and the plurality of power supply voltages in response to the switching control signals, wherein the duty signal generator is configured to perform the PWM by chaining a modulation scheme in response to the selection signal when the input signal crosses each level boundary of the multi-level.

14. An audio processing apparatus, comprising:

a volume table and a multiplier, wherein the volume table outputs a volume value in response to a received volume control signal, and the multiplier multiplies audio source data by the volume value to output an input signal; and a class-D amplifier configured to convert the input signal to a duty signal having multi-level and configured to drive output nodes to be connected to a load based on the duty signal, wherein the class-D amplifier comprises:

an error amplification circuit configured to output an error signal by amplifying a difference between the input signal and an output signal provided at the output node;

a duty signal generator configured to output the duty signal having a pulse width corresponding to a level of the error signal by performing a pulse width modulation (PWM) on the error signal based on a triangular wave signal;

a level selection circuit configured to receive the error signal and configured to generate a level selection indicating a level to which the error signal belongs of a plurality of levels (multi-level) into which peak values of the error signal are divided;

a driver and control block configured to receive the duty signal, configured to generate switching control signals corresponding to the duty signal in response to the level selection signal, and configured to provide a selection signal to the duty signal generator; and an output stage connected to a ground voltage and a plurality of power supply voltages, the output stage configured to drive an output node with the ground voltage and at least two of the plurality of power supply voltages in response to the switching control signals, wherein the duty signal generator is configured to perform the PWM by chaining a modulation scheme in response to the selection signal when the error signal crosses each level boundary of the multi-level.

15. A method of driving a class-D amplifier, the method comprising:

generating an error signal by amplifying a difference between an input signal and an output signal;

generating a duty signal having a pulse width corresponding to a level of the error signal by performing a pulse width modulation (PWM) on the error signal based on a triangular wave signal;

receiving the error signal to generate a level selection indicating a level to which the error signal belongs of a plurality of levels (multi-level);

receiving the duty signal to generate switching control signals corresponding to the duty signal in response to the level selection signal; and driving an output node with at least two voltages of a ground voltage and a plurality of power supply voltages in response to the switching control signals, wherein the PWM is performed by chaining a modulation scheme in response to the selection signal when the error signal crosses each level boundary of the multi-level.

* * * * *